(12) United States Patent
Tsironis

(10) Patent No.: US 11,867,736 B1
(45) Date of Patent: Jan. 9, 2024

(54) LOAD PULL SYSTEM USING WAVEGUIDE TUNER

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 17/514,558

(22) Filed: Oct. 29, 2021

(51) Int. Cl.
*G01R 27/32* (2006.01)
*G01R 31/28* (2006.01)
*G01R 35/00* (2006.01)

(52) U.S. Cl.
CPC ......... *G01R 27/32* (2013.01); *G01R 31/2822* (2013.01); *G01R 35/005* (2013.01)

(58) Field of Classification Search
CPC ... G01R 27/32; G01R 31/2822; G01R 35/005
See application file for complete search history.

(56) References Cited

U.S. PATENT DOCUMENTS

| | | | | |
|---|---|---|---|---|
| 5,276,411 | A * | 1/1994 | Woodin, Jr. | ........... H03H 7/383 |
| | | | | 333/116 |
| 6,674,293 | B1 | 1/2004 | Tsironis | |
| 6,980,064 | B1 * | 12/2005 | Boulerne | ................. H01P 5/04 |
| | | | | 333/263 |
| 7,282,926 | B1 * | 10/2007 | Verspecht | ............. G01R 27/32 |
| | | | | 324/641 |
| 9,625,556 | B1 | 4/2017 | Tsironis | |
| 10,345,422 | B1 | 7/2019 | Tsironis | |
| 2007/0171008 | A1 * | 7/2007 | Boulerne | ................. G01R 1/26 |
| | | | | 333/263 |
| 2013/0234741 | A1 * | 9/2013 | Mow | ..................... H01Q 5/328 |
| | | | | 324/750.01 |
| 2013/0321092 | A1 * | 12/2013 | Simpson | ............... G01R 27/00 |
| | | | | 333/17.3 |
| 2017/0141802 | A1 * | 5/2017 | Solomko | ............. H04B 1/0458 |

OTHER PUBLICATIONS

"Load Pull Measurements" [online], Wikipedia [retrieved on Nov. 18, 2016] Retrieved from Internet <URL:http://en.wikipedia.org/wiki/Load_pull>.
W Band Programmable Tuner Model 11075, Product Note 43, 1997, Focus Microwaves.
"Signal-flow graph" [online], Wikipedia [retrieved on Aug. 31, 2021]. Retrieved from Internet <URL: https://en.wikipedia.org/wiki/Signal-flow_graph>.
"Linear Actuator" [online], Wikipedia [retrieved on Apr. 25, 2020]. Retrieved from Internet <URL: https://en.wikipedia.org/wiki/Linear_actuator>.
"Regula falsi" [online], Wikipedia [retrieved on Aug. 26, 2021]. Retrieved from Internet <URL: https://en.wikipedia.org/wiki/Regula_falsi>.
"Lecture 20: Transmission (ABCD) Matrix" [online], EE 481/581—Microwave Engineering, Course Syllabus [retrieved on Jul. 13, 2015] Retrieved from Internet <URL: https://whites.sdsmt.edu/classes/ee481/notes/481Lecture20>.

* cited by examiner

*Primary Examiner* — Akm Zakaria

(57) ABSTRACT

A load-pull measurement system uses a PC controller, interface, calibration method and at least one new two-probe, waveguide slide screw impedance tuner; the tuner probes share the same waveguide section; they are inserted diametrically at fixed depth into facing each other slots on opposite broad walls of the waveguide. The tuner does not have cumbersome adjustable vertical axes controlling the penetration of the probes and its low profile is optimized for on-wafer operations. The carriages holding the probes are moved along the waveguide using electric stepper motors or linear actuators.

7 Claims, 12 Drawing Sheets

- - - - - LOOP①
———— LOOP②
- - - - - REVOLVING LOOP③

LOAD PULL SYSTEM USING WAVEGUIDE TUNER

PRIORITY CLAIM

Not Applicable

CROSS-REFERENCE TO RELATED ARTICLES

1. "Load Pull Measurements" [online], Wikipedia [retrieved on Nov. 18, 2016] Retrieved from Internet <URL:http://en.wikipedia.org/wiki/Load_pull>
2. W Band Programmable Tuner Model 11075, Product Note 43, Focus Microwaves August 1977.
3. Tsironis C., U.S. Pat. No. 6,674,293, "Adaptable Pre-Matched Tuner System and Method".
4. Tsironis C., U.S. Pat. No. 9,625,556, "Method for Calibration and Tuning with Impedance Tuners".
5. "Signal-flow graph" [online], Wikipedia [retrieved on Aug. 31, 2021]. Retrieved from Internet <URL: https://en.wikipedia.org/wiki/Signal-flow_graph>.
6. "Linear Actuator" [online], Wikipedia [retrieved on Apr. 25, 2020] Retrieved from Internet <URL: https://en.wikipedia.org/wiki/Linear_actuator>.
7. Tsironis C., U.S. Pat. No. 10,345,422, "Compact Harmonic Tuner System with Rotating Probes", column 7 lines 10ff.
8. "Regula falsi" [online], Wikipedia [retrieved on Aug. 26, 2021]. Retrieved from Internet <URL: https://en.wikipedia.org/wiki/Regula_falsi>.
9. "Lecture 20: Transmission (ABCD) Matrix" [online], EE 481/581—Microwave Engineering, Course Syllabus [retrieved on Jul. 13, 2015] Retrieved from Internet <URL: https://whites.sdsmt.edu/classes/ee481/notes/481Lecture20>.

BACKGROUND OF THE INVENTION

This invention relates to load and source pull testing of RF and millimeter-wave transistors and amplifiers using remotely controlled electro-mechanical waveguide impedance tuners.

A popular method for testing and characterizing RF and millimeter-wave transistors in their non-linear region of operation is "load pull" (see ref. 1). Load pull is a device measurement technique employing microwave impedance (load-pull) tuners and other microwave test equipment as shown in FIG. 1. The waveguide tuners 2, 4 (see ref. 2) are used in order to manipulate the microwave impedance conditions under which the Device Under Test (DUT, or transistor, 3) is tested; the test signal is provided by a signal source 1 and the out-coming power is measured by a power meter 5; the whole is controlled by a PC controller 6, which includes an electronic interface to communicate with the instruments 1, 5 and the tuners 2, 4 using digital control and communication cables 7, 8 and 9.

DESCRIPTION OF PRIOR ART

Waveguide impedance tuners include, in general, a low-loss transmission line 26, FIG. 2, and a conductive tuning element (tuning probe, 20) inserted in a slot 28 machined into the waveguide 23; the probe 20 is a conductive rod and is attached to a complex, adjustable high precision motor-controlled 25 vertical axis 22 and is inserted into the slot 28 and moved 24 along the axis of the waveguide; this movement of the tuning probe creates, in a certain frequency range, a controllable variable reactance which, combined with the following matched load allow the synthesis of various impedances (or reflection factors) which are present at the test port 27, covering up to the quasi totality of the Smith chart (the polar impedance mapping display shown as normalized reflection factor, FIG. 3). The impedance synthesis follows a path 30, 31 between the matched load at the origin (50Ω) and an arbitrary target-1. Inserting the tuning probe into the slot creates path 30 and moving it along the slot creates path 31. The relation between reflection factor Γ and impedance Z is given by Γ=(Z−Zo)/(Z+Zo), wherein Z=R+jX and wherein Zo is the characteristic impedance. A typical value used for Zo is 50Ω.

When conductive tuning probes (typically rods) 20, FIG. 2, penetrate into the waveguide 26, they capture and deform the electric field, which is concentrated in the area 29 between the bottom tip of the probe 20 and the ground plane 23 of the waveguide. This field deformation allows creating the high and controllable reflection factors. The main disadvantage of this embodiment is the requirement for high precision and resolution and, by consequence, tall and cumbersome vertical probe movement mechanisms 22 precise over their entire travel range and able to fully insert or extract the tuning probe from the waveguide cavity, since the significant portion of reflection occurs when the probe tip is very close to the inner wall of the waveguide (ground plane). This movement process slows down the tuning procedure for two reasons: (a) when the probe is withdrawn, the vertical movement is lengthy and much less effective in terms of generating useful reflection factor, and (b), because the vertical moving resolution is constant, enhanced positioning accuracy and resolution are required all the way due to high tuning sensitivity in the high reflection area, when the probe is deeply inserted and close to the ground plane.

Related prior art (see ref. 3) does not teach impedance tuners with fixed penetration (or vertical position) dual tuning probes; prior art tuners require at least one high precision complex vertical axis to be able to create path 30 in FIG. 3 and tune. Neither relevant prior art ref. 3, 4 or 7 teach a compact waveguide tuner using alternatively swapping and crossing over tuning probes in a shared transmission line structure. This overlapping structure, though, is essential and compatible with the proposed low profile, compact size tuner and attractive, because of the new high speed adaptive tuner operation (see ref. 4).

BRIEF SUMMARY OF THE INVENTION

The invention discloses a load pull measurement system using a new type slide screw tuner and associated control software. The tuner configuration, different from prior art, uses horizontal-only high-speed movement techniques of the tuning probes and also a preferred fast, custom impedance synthesis (tuning) method, once the tuner is properly calibrated.

The impedance tuner itself, of which a conceptual cross section is shown in FIG. 4, uses a low loss waveguide transmission line 40 and two diametrical tuning probes 42. The tuning probes 42 are, typically, conductive rods and are mounted on mobile carriages 45. The carriages are placed facing each-other across the waveguide and slide 43 seamlessly and precisely along the waveguide top and bottom walls. They hold the tuning probes (conductive rods) 42 and keep them inserted at a fixed depth in vertical slots 46, which are parallel to the axis of the waveguide i.e., there is no need for any vertical probe control. In order to allow the tuning rods to cross over without mechanical conflict, the slots are slightly offset of the center line of the waveguide, by at least one diameter (thickness) of a tuning rod. A medium size reflection (S11≈0.5-0.7) is created by either tuning rod leading to a different tuning mechanism as shown in FIG. 3 (traces 32, 33). Both tuning mechanisms shown in FIG. 3 yield the same result: starting from the matched load (50Ω) they allow tuning to targets 1 or 2. The result is the same, only the control mechanisms differ.

The carriages 45, 52, 53 are controlled using high-speed electric stepper motors 54 and ACME rods 51 or actuators (see ref. 6) thus eliminating this way additional control gear. Last, not least, the tuning mechanism, liberated from cumbersome and expensive high resolution vertical probe control and movement delays, benefits also from inherent lower tuning error sensitivity to mechanical probe positioning tolerances close to |Γ|≈1.

BRIEF DESCRIPTION OF THE SEVERAL VIEWS OF THE DRAWINGS

The invention and its mode of operation will be better understood from the following detailed description when read with the appended drawings, in which:

FIG. 2A depicts a front view of the entire tuner; FIG. 2B depicts a cross section of the tuning probe (typically a conductive rod) entering the waveguide slot.

FIG. 6A depicts the reflection area of a tuning probe; FIG. 6B depicts the overall signal flow graph; FIG. 6C identifies the signal transmission and nodes of the tuner depicted in the signal flow graph.

DETAILED DESCRIPTION OF THE INVENTION

Figure 1:
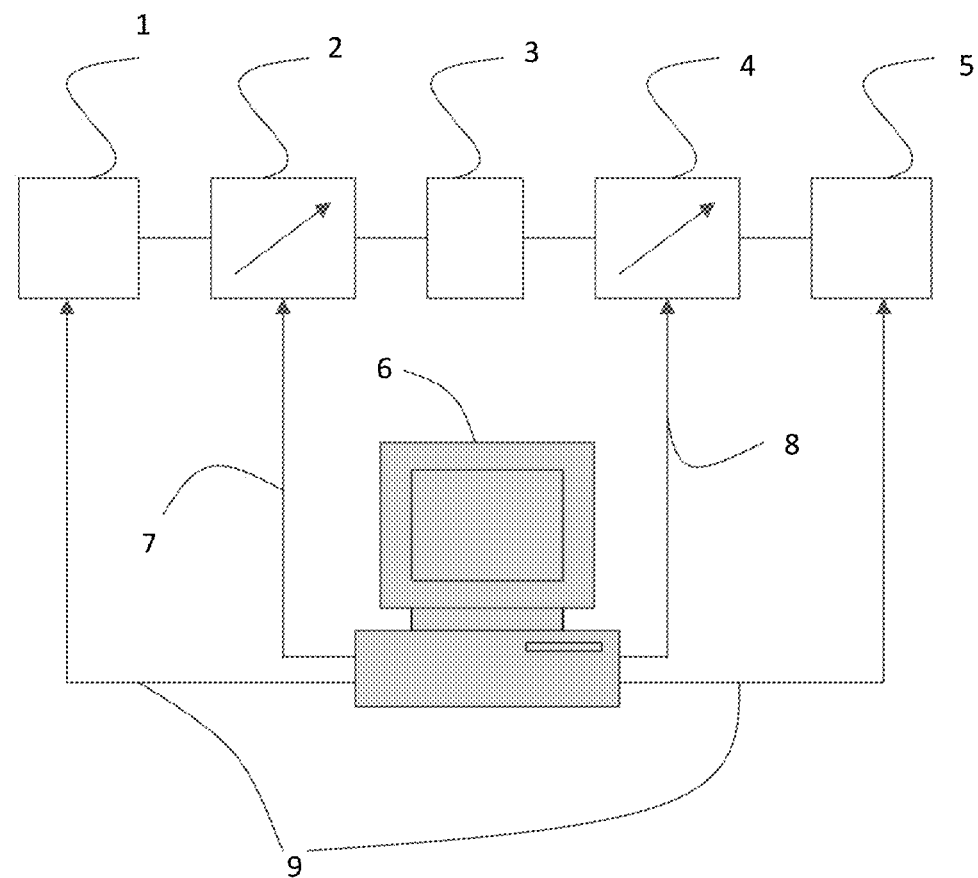
FIG. 1 depicts prior art: a typical generic automated load pull test system.
Figure 2:
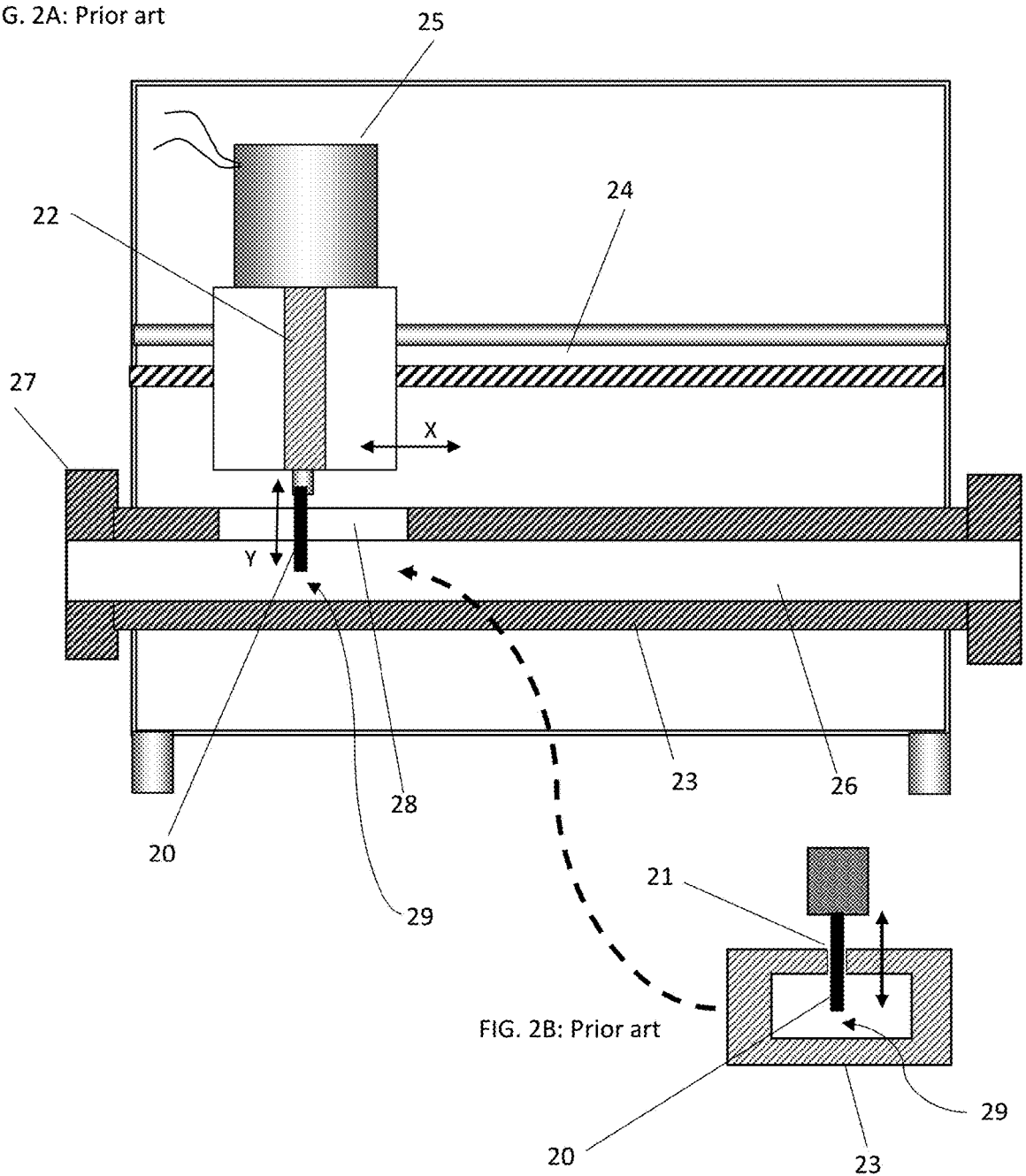
FIGS. 2A through 2B depict prior art: a single probe waveguide impedance tuner.
Figure 3:
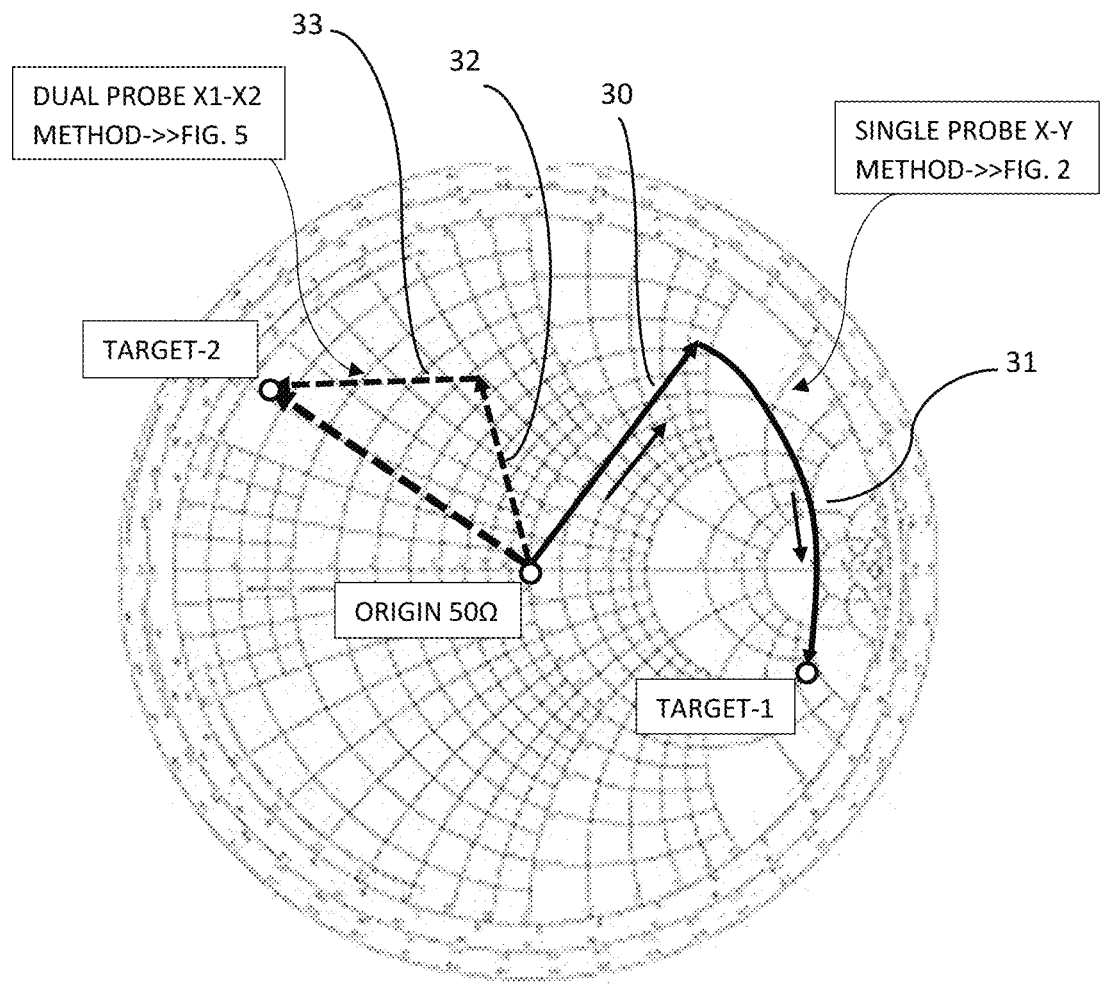
FIG. 3 depicts partly prior art: a Smith chart and two possible trajectories of impedance synthesis (tuning) to reach a target impedance starting from the origin of 50Ω. Reaching target-1 uses the prior art single-probe technique with horizontal and vertical control; reaching target-2 uses the new two-probe technique with horizontal only and without vertical control.

This invention discloses a high frequency (RF, microwave, millimeter wave), computer-controlled impedance tuning system, suitable for load pull measurements, which includes at least one electro-mechanical waveguide impedance tuner, the calibration method of the tuner and an impedance synthesis (tuning) method. The tuner (FIGS. 4 and 5) uses a low loss waveguide transmission airline 40, which includes two broad top/bottom walls, two narrow sidewalls and two slots 46 cut into the broad walls, one on the top wall and one on the bottom wall. The slots run parallel to the waveguide longitudinal axis and are positioned opposite to each other and slightly offset from the symmetrical center line of the waveguide. The offset dimension is selected to allow two tuning probes (typically metallic or metallized rods 42) to cross over without touching. This structure is preferred for economy of space, because it uses slots of a total length of one half of a wavelength 56 plus the thickness of one tuning rod. An alternative configuration, where the tuning rods would not cross over, would, in principle also work, but the slot or the sum of the slots (and the tuner) would have to be twice as long. The horizontal control of the carriages 52 and 53 can, instead of motor and ACME screws, can also be accomplished using linear electric actuators (see ref. 6); the actuators have a motorized body, and their rotor axis is replaced by the extended horizontal ACME screw 51.

Figure 4:
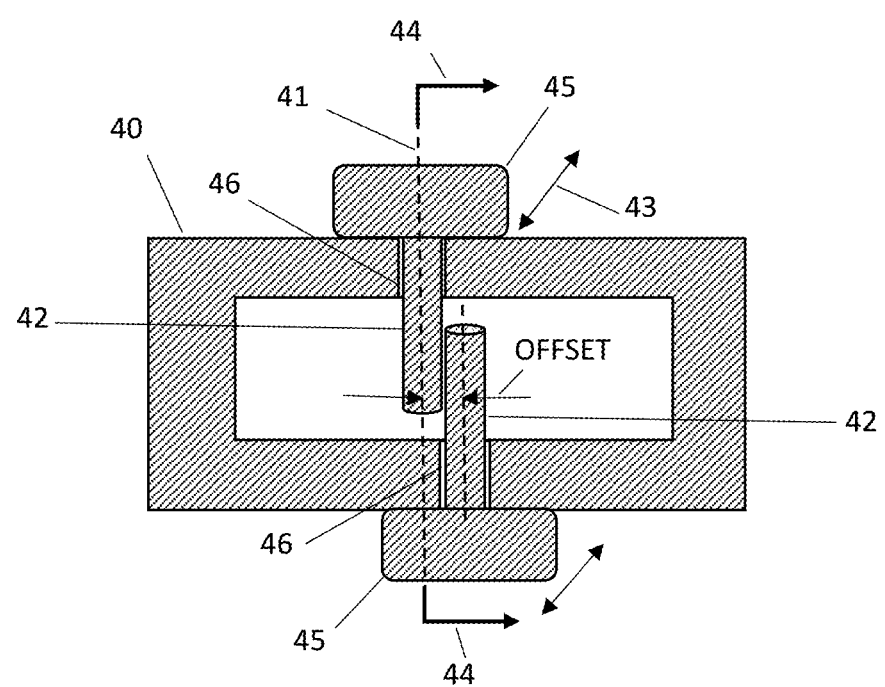
FIG. 4 depicts a cross-section through a waveguide with two conductive tuning rods (probes) entering from opposite sides into slightly offset slots.
Figure 5:
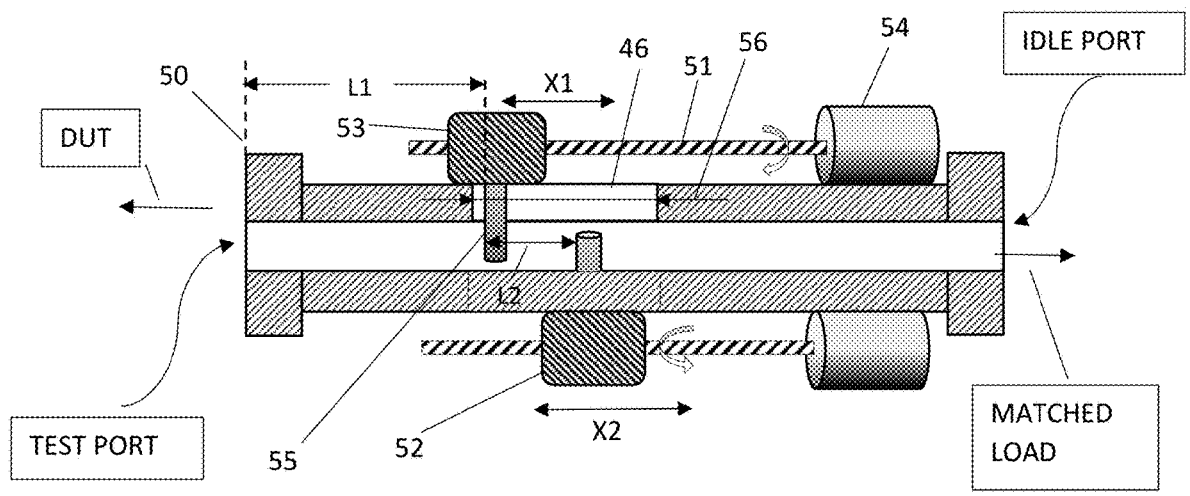
FIG. 5 depicts a front view of the waveguide tuner with two crossing over tuning probes.

FIG. 5 shows a front view of the waveguide tuner as seen in the cross section 41, 44 of FIG. 4: the slots 46 can be seen, to allow the tuning probes (rods or blocks) to traverse contactless 21, and their effective length 56 is seen as well; the mobile carriages 52 and 53 are controlled by the ACME screw 51 along the waveguide via the stepper motors 54; the reference position of carriage 53 is X1 and of carriage 52 is X2 relative to a common arbitrary zero position. The zero position must be common, because the calibration routine requires knowledge of the position of each probe relative to the test port. The electric distance of the first tuning probe 55 from the test port 50 is L1 and the electric distance between the two tuning probes is L2; the lower slot 46 is hidden in FIG. 5 as it is evident from the view through the cross section 44 in FIG. 4.

Figure 7:
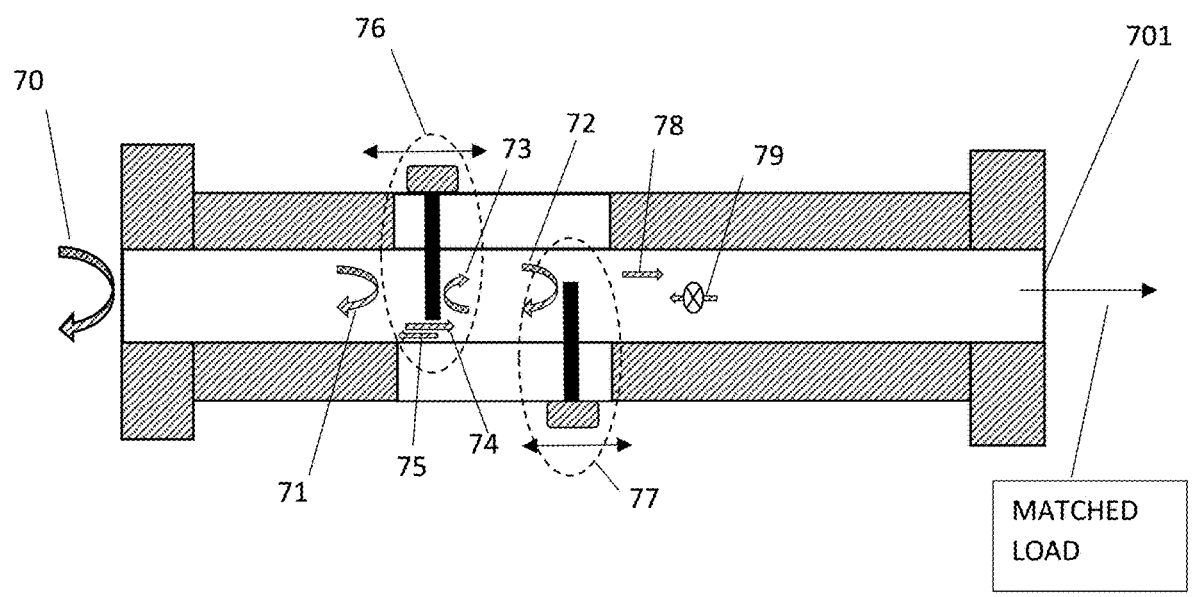
FIG. 7 depicts signal flow and multiple reflections created by the two probes of a two-probe impedance tuner with shared waveguide. The probes can swap positions with regard to the test port 70.

The signal propagation trajectories are shown in FIG. 7: the total reflection factor 70 is a function of the combined positions X1 and X2 of the two probes: S11(X1,X2) and is the vector-sum of the reflection factors 71 and 75 of both probes S11(X1) and S11(X2): S11(X1,X2)=S11(X1)+S11(X2), (eq. 6) all referenced at the test port 70. The tuning probe 76, in this configuration closest to the test port, generates the primary reflection 71. Since this reflection is selected not to be total, there is a signal portion 74 traversing towards the secondary tuning probe 77; this signal portion is then reflected back 72 towards the primary probe; again, a portion 75 of this reflected back signal traverses the primary probe towards the test port and adds to the total reflection 70. The signal 72 reflected at the secondary probe is also reflected back 73 at the primary probe, and so on, creating the phenomenon of a multiple reflection. In mechanical terms this appears like a turbulence. This back and forth bouncing of signal is well described using signal flow graphs (see ref. 5). Instead, since the tuner is terminated 701 with a matched load any escaping signal 78 is not reflected back 79 and therefore ignored.

Figure 6A:
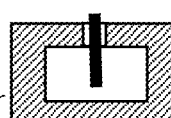
FIGS. 6A through 6C depict the signal flow graph (SFG) of the two-probe impedance tuner.
Figure 6B:
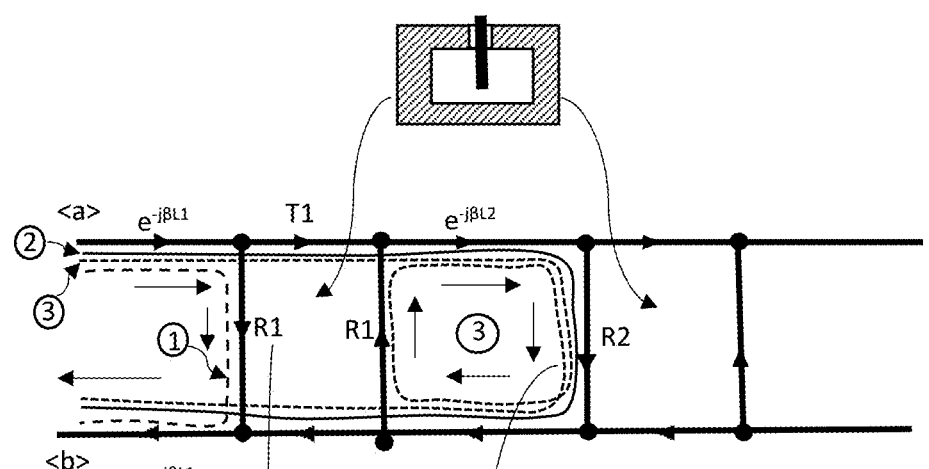
Figure 6C:
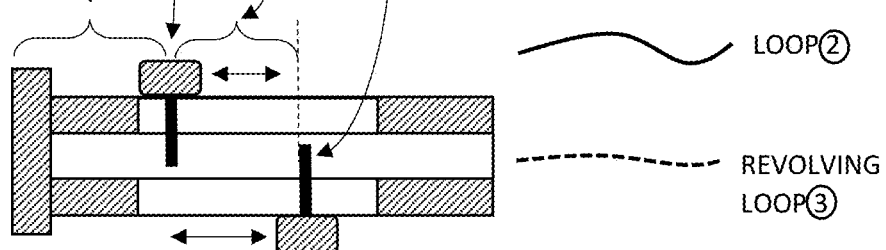

FIG. 6B shows the signal flow graph describing the tuner, which is also shown schematically in FIG. 6C: Each pair of nodes represent a port and each branch the complex signal flow factor S11&S22 or S21&S12 between the ports; each tuning probe (FIG. 6A) is described by a two-port having a reflection factor R (S11=S22) and a transmission factor T (S21=S12): probe 1 generates R1 and T1, probe 2 generates R2 and T2. The injected signal <a> returns as <b> after following several loops: between each probe there is a delay $\exp(-j\beta L)$; loop 1 represents the primary reflection, loop 2 the secondary reflection and loop 3 the multiple reflections; it must be remarked that loop 3 is revolving (repeating) adding each time a decreasing amount to the total reflection 70; loop 3 resumes in an infinite, but rapidly converging, series of reflected signal power vectors generating the overall reflection vector 70. The transmission factors T1 and T2 represent the portion of signal traversing the tuning probe, whereas the reflection factors R1 and R2 represent the reflected portion. Transmission lines are described by simple phase delays $\beta=2\pi/\lambda$. Assuming the probes represent capacitors C1 and C2 then we can approximate: $R1=-j\omega C1Zo/(2+j\omega C1Zo)$; $R2=-j\omega C2Zo/(2+j\omega C1Zo)$; $T1=2/(j\omega C1Zo)$ and $T2=2/(2+j\omega C2Zo)$. The section after probe 2 is matched to 50Ω, therefore signal is not returning and the associated R2 and T2 are ignored. By generating the signal loops 1, 2, 3, ... which contribute to the overall reflected signal <b> we obtain for the reflection factor at the test port: $S11=$<b>/<a>$\{e^{-j\beta L1}-R1-e^{-j\beta(L1+L2)}\cdot R2\cdot T1^2-e^{-j\beta(L1+2L2)}\cdot T1^2 R2^2\cdot R1+\}$ ...; the series of loops is truncated, since the third loop (LOOP 3) is repeated n times with n=1,2,3,4 ... towards infinite, but its contribution to the total reflection factor at the test port is rapidly decreasing, since all s-parameters R (reflection) and T (transmission) and their products appearing at higher power $T1^{4n}$, $R1^{2n}$, $R2^{4n}$ etc. are smaller than 1 and rapidly vanishing, forming this way a converging infinite sum. The transmission between the test port 70, probe 1, 73 and probe 2, 77 is described by lossless transmission lines having a phase $-2\pi L/\lambda$, where λ is the wavelength λ=300 mm/Frequency (GHz).

Figure 11:
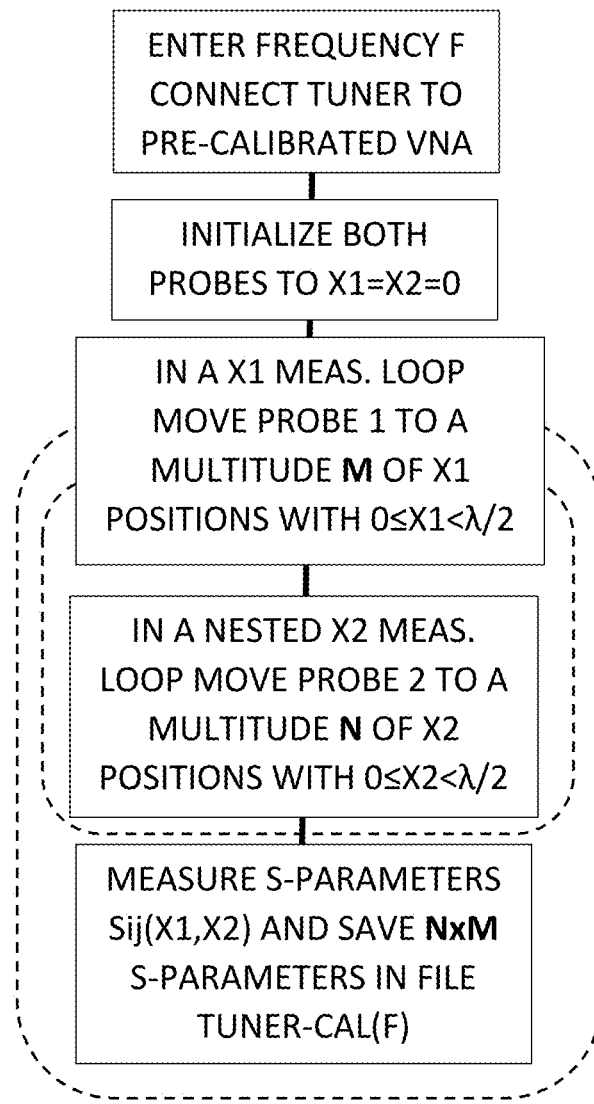
FIG. 11 depicts the flowchart of the calibration algorithm of the shared-waveguide 2-probe fixed-penetration tuner.

The tuner calibration process at a given frequency F is possible using a traditional method (FIG. 11) consisting in measuring, on a pre-calibrated vector network analyzer (VNA) s-parameters between the test and idle ports (FIG. 5) for all N*M permutations of 1,2,3 ... N times X1 and 1,2,3 ... M times X2 tuning probe positions, with typical N~M values of at least 100, in order to generate a dense enough grid of calibrated points of no more than 3.6° angle between points on the Smith chart. In this case the total calibration of 10,000 points will last an average of 2.5 hours (assuming 1 second per point, including probe movement, data collection and saving).

The preferred embodiment of a fast de-embedding calibration method allows a must faster operation as follows: measure first the s-parameters of the slabline with both probes initialized (X1=X2=0) and save in a zero matrix [S0]; then move probe 1 to a multitude of N positions X1 and measure s-parameters Sij(X1) between the test and idle ports of the tuner and save the data in a file S1; then initialize probe 1 to X1=0, move probe 2 to a multitude M positions X2, measure s-parameters Sij(X2) and save in a file S2. Subsequently the data in files S1 and S2 are retrieved and saved in rapid access memory RAM of the system controller; since the probes may cross over each other, X1 can be equal, bigger or smaller than X2 and this decides on the sequence of de-embedding: if X1≤X2, then Sij(X2) is de-embedded, i.e., cascaded with $[S0]^{-1}$ and re-saved in file S2; else, if X1>X2, then Sij(X1) is de-embedded, i.e., cascaded with $[S0]^{-1}$ and re-saved in file S1; subsequently all M*N permutations of the s-parameters in updated files S1 and S2 saved in RAM, are cascaded into a new set of M*N s-parameter sets Sij(X1,X2) which are the calibration data of the tuner at frequency F; presumably all s-parameter matrix cascading is executed after converting s-parameters to ABCD or transfer (T-parameters), see ref. 9, and back to s-parameters; the result of this operation lasts much less than before: a total of M+N points are measured and data are processed very fast in memory. The total time (assuming 1 second per point, as before) is: 200*1 sec+20 sec (processing time)≈4 minutes, compared with approximately 2.5 hours, a significant gain.

Figure 10:
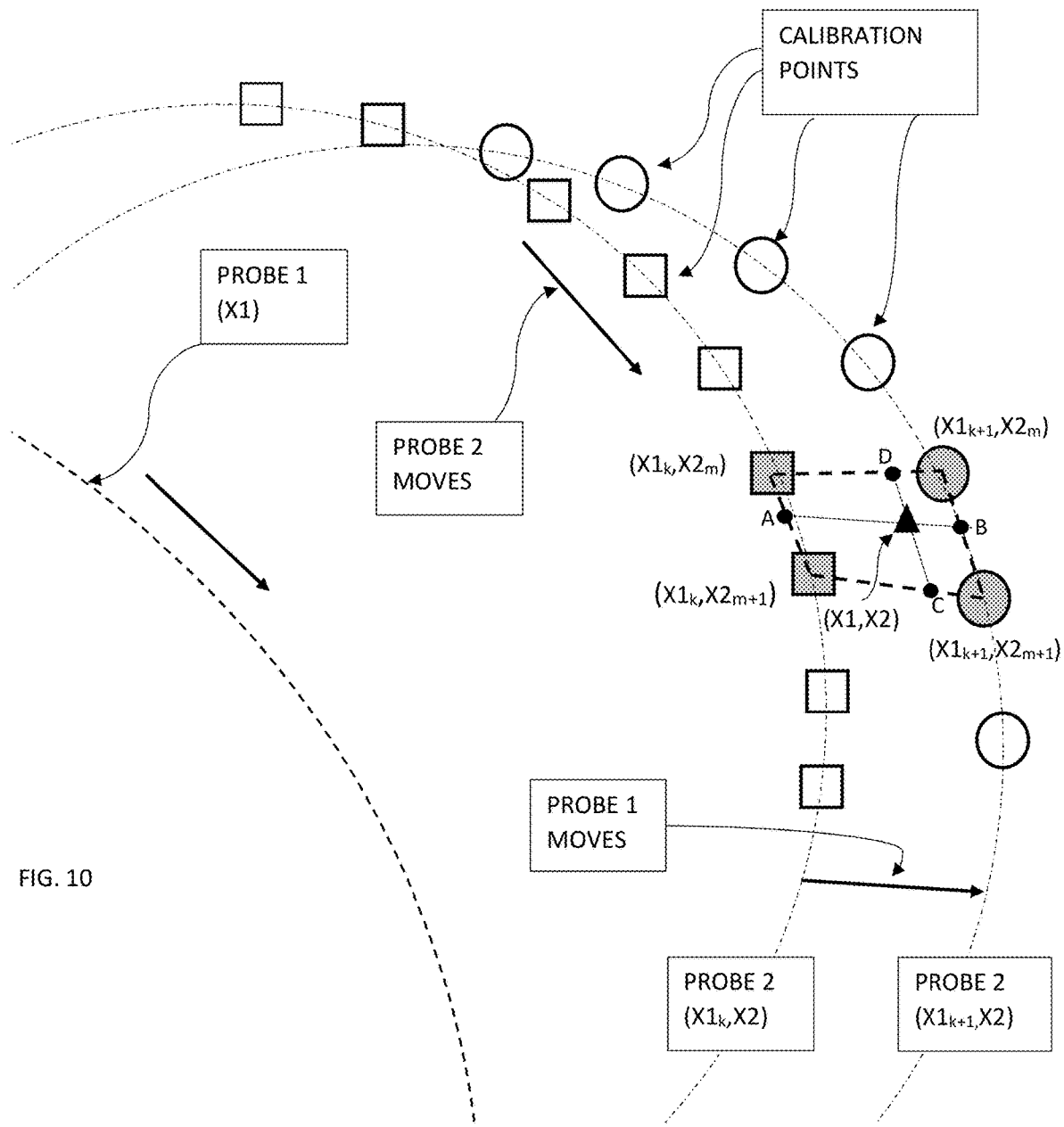
FIG. 10 depicts the tuning vector composition and interpolation strategy of the two-probe tuner with fixed probe insertion depth and shared waveguide.

In order to synthesize a large number of possible target impedances using a limited number of calibration data requires adequate interpolation routines, because the tuner has millions of possible states (depending on the frequency and step resolution of the carriage control, the probes can be set to 1000 or more distinct X1 and X2 positions (steps), in which case we have 1 million or more tunable impedances). The interpolation routine allows accurate determination of the s-parameters Sij(X1,X2) of the tuner for any arbitrary probe settings (X1,X2) of the tuning probes, based on the four closest calibration points $(X1_k,X2_m)$, $(X1_{k+1},X2_{m+1})$, $(X1_{k+1},X2_m)$ and $(X1_k,X2_{m+1})$, each pair selected on either the X1 or the X2 direction or trace of probe movement (FIG. 10); herein the calibrated probe positions are selected to be successive: $X1_k \leq X1 < X1_{k+1}$ (on the X1 trace) and $X2_m \leq X2 < X2_{m+1}$ (on the X2 trace), in order to create a polygon between the above calibrated points, that includes the tunable point with target coordinates (X1,X2); once these four points are determined, the interpolation executes in two steps: in step 1 linear interpolation allows determining s-parameters of four new interpolated points, marked in FIG. 10 as A, B, C, D: as follows:

$$Sij(A)=Sij(X1_k,X2_m)+(X2-X2_m)/(X2_{m+1}-X2_m)\cdot(Sij(X1_k,X2_{m+1})-Sij(X1_k,X2_m)); \quad [eq.1]$$

$$Sij(B)=Sij(X1_{k+1},X2_m)+(X2-X2_m)/(X2_{m+1}-X2_m)\cdot(Sij(X1_{k+1},X2_{m+1})-Sij(X1_{k+1},X2_m)); \quad [eq.2]$$

$$Sij(C)=Sij(X1_k,X2_m1)+(X1-X1_k)/(X1_k1-X1_k)\cdot(Sij(X1_{k+1},X2_{m+1})-Sij(X1_k,X2_{m+1})); \quad [eq.3]$$

$$Sij(D)=Sij(X_k,X2_m)+(X1-X1_k)/(X1_{k+1}-X1_k)\cdot(Sij(X1_{k+1},X2_m)-Sij(X1_k,X2_m)); \quad [eq.4]$$

In step 2 then, a new linear interpolation generates Sij(X1,X2) using these four new first order interpolated points Sij(A), Sij(B), Sij(C) and Sij(D) as follows:

$$Sij(X1,X2)=\{Sij(A)+(X1-X1_k)/(X1_{k+1}-X1_k)\cdot(Sij(B)-Sij(A))+Sij(C)+(X2-X2_{m+1})/(X2_m-X2_{m+1})\cdot(Sij(C)-Sij(D))\}/2 \quad [eq.5].$$

Once the tuner is calibrated and the s-parameter data Sij(X1,X2) data are saved in a calibration file TUNER-CAL (F) at a frequency F, they can be used to synthesize, either manually or in an automatic measurement procedure, user-defined impedances or reflection factors; the tuning process executes in a number of steps (FIG. 9): in a first step, after the frequency, the number of allowable search iterations NMAX and the tuning tolerance TOL (the allowable vector difference between the target and the tuned reflection factor) are defined, the process loads the data of the tuner calibration file in random access (fast) RAM memory. The actual tuning process then, either automatically or manually triggered, imports one or more target reflection factors Γ or impedances Z. The search starts by comparing the calibrated reflection factors S11(X1,X2) saved in the calibration data with each imported r and determines a set of starting values (X1o,X2o) for which the vector distance in form of an error function $EF=|S11(X1o,X2o)-\Gamma|^2$ is smallest (i.e., finding the smallest vector distance between the target Γ and the closest calibrated point) to be used in the subsequent search.

Figure 9:
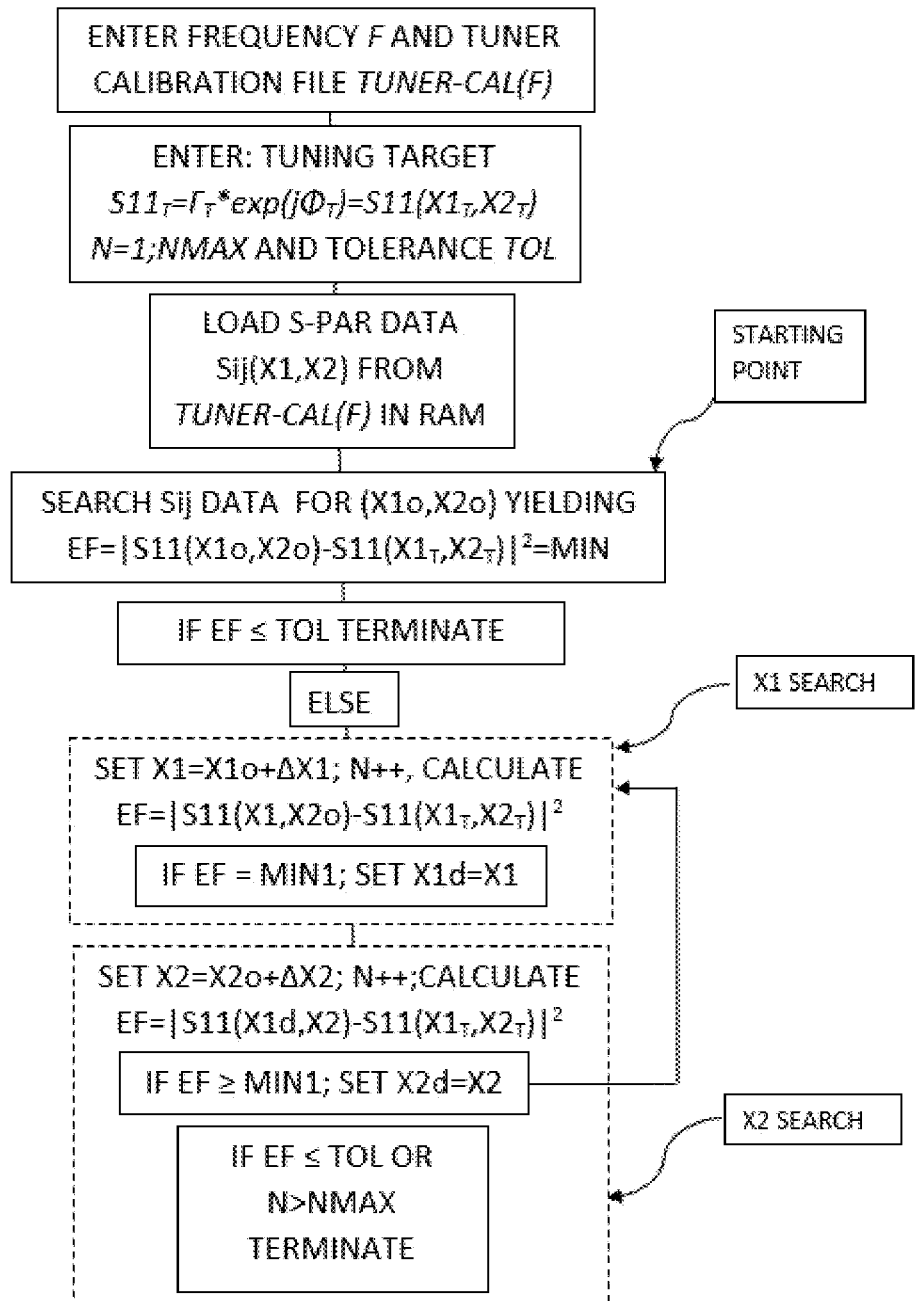
FIG. 9 depicts the flowchart of the impedance synthesis (tuning) process.

If this value EF is already smaller than the prescribed tuning tolerance TOL, the X1o,X2o values are saved, and the search terminates with X1.final=X1o and X2.final=X2o. Else, starting with X1o,X2o, the process modifies X1 and X2 alternatively by small amounts δX1 and δX2, which are proportional (in a regula falsi kind of algorithm, see ref. 8) to the change of the error function EF, the new interpolated value S11(X1,X2) is calculated and EF re-calculated until a new local minimum of EF is reached. This means, if EF increases, then the δX1 or δX2 correction becomes negative and the X1 or X2 search reverses direction. After a first local minimum of EF, the search changes direction, conserves the actual X1 value and changes X2 as before; each time the EF function traverses a local minimum the search switches from X1 to X2 and back. After a number of iterations the vector (X1,X2) converges to final values X1.final or X2.final, either because EF is smaller that the tuning tolerance or the search is truncated, because the previously defined maximum number of iterations NMAX is exceeded. The search may end up in a local minimum with EF larger than the tuning tolerance, though in the case of only two variables a local minimum is improbable; any such difference would be related to the density of calibrated points or the size of the tuning tolerance (which cannot be zero, since the stepping motor control of the tuning probes dictates that the tuner, even with at very high positioning resolution, because of the use of stepper motors, remains digital). To be able to execute this procedure, requires the accurate interpolation routines described above, i.e., mathematical relations that allow calculating s-parameters Sij of the tuner at arbitrary probe positions (X1,X2) different than the calibrated positions. For best accuracy these relations must describe approximately enough the natural behavior of the tuner as shown in (FIG. 9).

Figure 8:
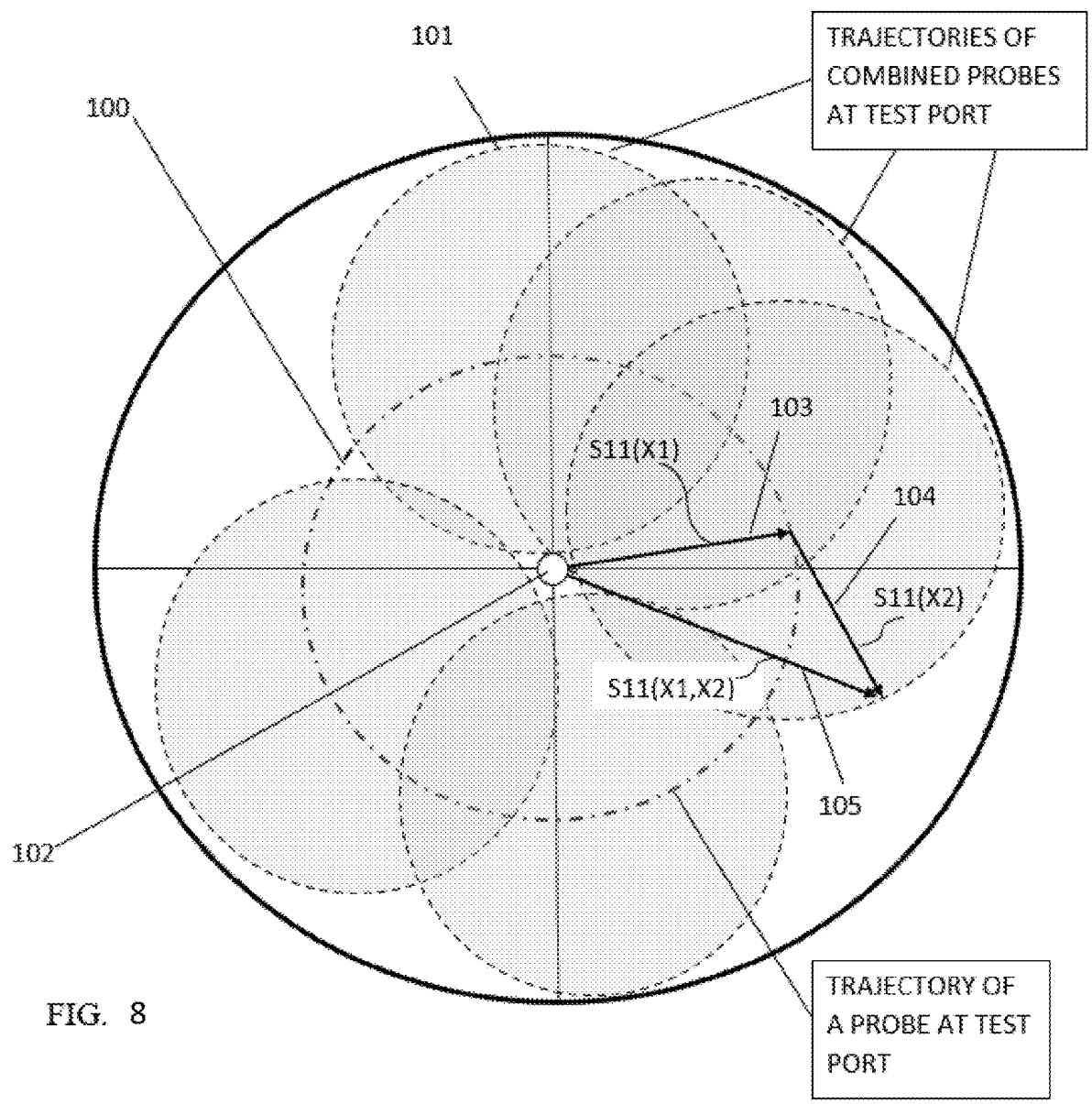
FIG. 8 depicts the Smith chart coverage mechanism using two-probe impedance tuner with fixed probe insertion depth.

FIG. 8 depicts schematically the overall reflection factor synthesis mechanism: each probe creates at its own reference plane 71 or 72 (FIG. 7) concentric reflection factor circles represented at test port reference plane as trace 100 on the Smith chart (FIG. 8). The total reflection factor trace 101 is created by a planetary epicycloid superposition of the two reflection factor vectors around the center 102 (one circle rotates around a point at the periphery of the other). When the probes cross over the circles swap. The total reflection factor vector 105 is created by the vector sum of vector 103 (from the first probe) and the vector 104 (from the second vector) as described in equation 6.

Figure 12:
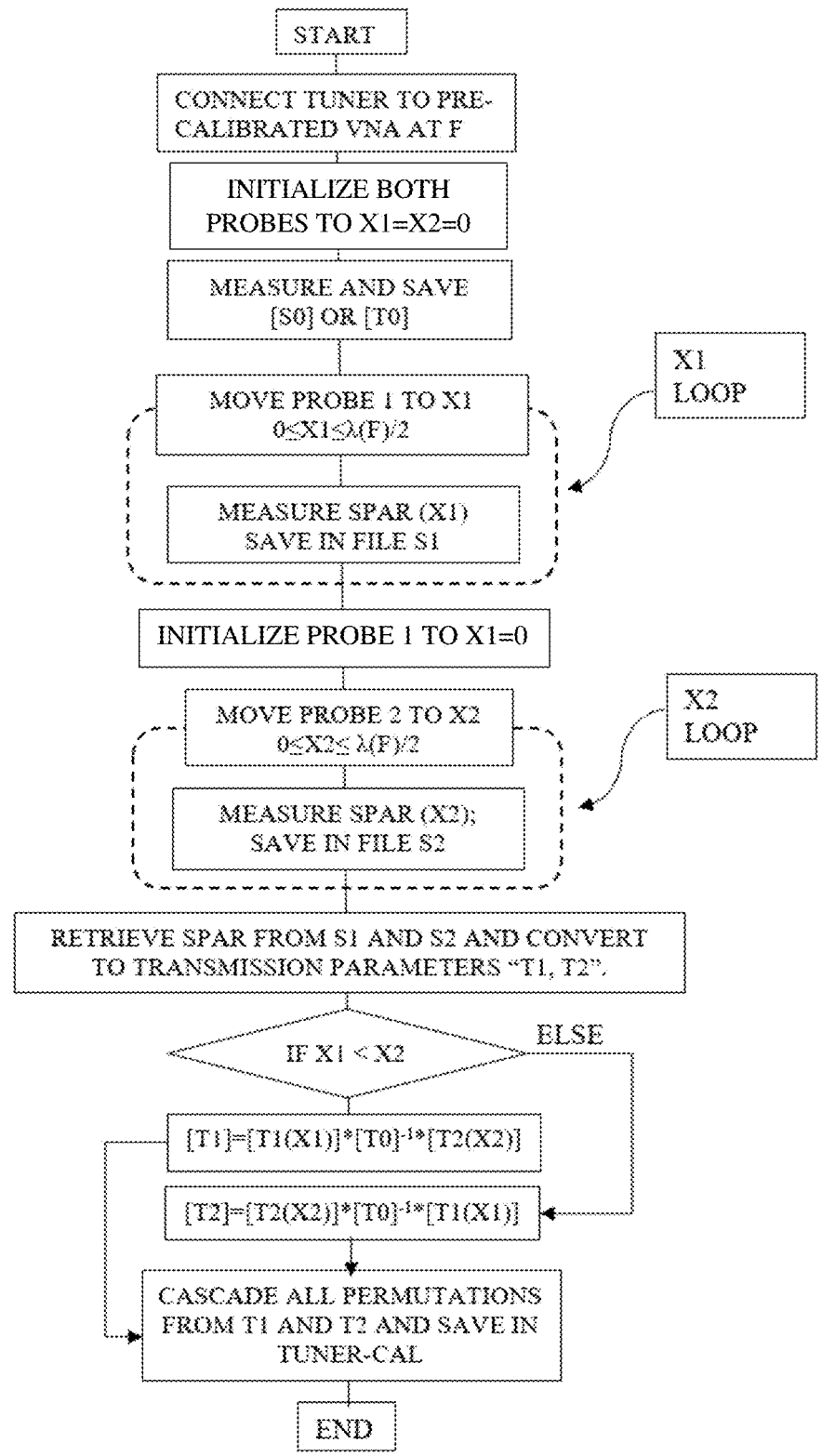
FIG. 12 depicts the flowchart of the fast de-embedding calibration algorithm of the shared-waveguide 2-probe fixed-penetration tuner.

FIG. 12 depicts the flowchart of the fast de-embedding calibration algorithm of the shared-waveguide 2-probe fixed-penetration tuner. The procedure executes as follows: After connecting to a pre-calibrated VNA, initialize both probes to X1=0, X2=0 and measure the initialization matrix [S0]=[S(0,0)]; then execute two loops, an {X1} loop and an {X2} loop, while keeping X2=0 and X1=0 correspondingly, measuring and saving s-parameters in files S1 and S2 correspondingly. In both cases X1 and X2 move between 0 and λ/2. After terminating, the data in files S1 and S2 are compared. When X1<X2 (i.e. if probe 1 is closer to the test port than probe 2), then the data in S2 are de-embedded using [S0]$^{-1}$ and resaved, and if X1≥X2 it is the data in S1 that are de-embedded with [S0]$^{-1}$ and re-saved. Finally the matrix [S(X1,X2)] is created by concatenating (cascading) all updated S1 and S2 s-parameter permutations.

Obvious alternative embodiments of fixed penetration tuning probes, diametrically inserted into and sharing the same slabline of waveguide slide screw impedance tuners and associated calibration and tuning methods shall not impede on the core idea of the present invention.

What is claimed is:

1. An automated load pull tuner comprising:
a slotted rectangular waveguide transmission line, having an input port and an output port,
two conductive broad walls and two conductive narrow sidewalls,
two remotely controlled mobile carriages C #1 and C #2 sliding along the waveguide transmission line,
wherein
    each carriage controls a tuning probe inserted into longitudinal slots into the waveguide transmission line,
and wherein
    the slots are placed diametral across the opposite broad walls of the waveguide transmission line,
and wherein
    the mobile carriage C #1 controls a tuning probe P #1 and the mobile carriage C #2 controls a tuning probe P #2.

2. The automated load pull tuner of claim 1,
wherein
    the tuning probes are at least partially conductive rods, have a diameter D and fit contactless into the slots,
and wherein
    the slots are positioned symmetrically offset of a center line along the waveguide transmission line by at least one half of the diameter D of the tuning probes, which are inserted diametral into the slots from the opposite broad walls and are kept at a fixed penetration into the slots during movement along the waveguide transmission line.

3. The automated load pull tuner of claim 2,
wherein
    the carriage C #1 moves the tuning probe P #1 to a position X1 along the waveguide transmission line from the input port and the carriage C #2 moves the tuning probe P #2 to a position X2 along the waveguide transmission line from the input port,
and wherein
    the tuning probes P #1 and P #2 have a common initial position at a distance X1=X2=X0 from the input port along the waveguide transmission line.

4. The automated load pull tuner of claim 2,
wherein
    the slots are at least one half of a wavelength (λ/2) long at a minimum frequency of operation (Fmin) of the automated load pull tuner.

5. A calibration method for the automated load pull tuner of claim 1 comprising the following steps:
a) connect the automated load pull tuner to a vector network analyzer, calibrated at a frequency F;
b) initialize both tuning probes by moving them to positions X1=X2=X0 along the waveguide transmission line relative to the input port;
c) measure s-parameters of the automated load pull tuner and save in a zero matrix [S0];
d) in a movement-measurement loop:
    move the tuning probe P #1 to a multitude M>1 of positions X1,
    whereby X0≤X1≤X0+λ(F)/2,
    measure s-parameters Sij(X1), whereby {i,j}={1,2},
    save (X1,Sij(X1)) in a data file S1;
e) move the probe P #1 to the position X1=X0;
f) in a movement-measurement loop:
    move the tuning probe P #2 to a multitude N>1 of positions X2,
    whereby X0≤X2≤X0+λ(F)/2, measure s-parameters Sij(X2), whereby $\{i,j\}=\{1,2\}$, save (X2,Sij(X2)) in a data file S2;

g) retrieve data (X1,Sij(X1)) from the data file S1 and (X2,Sij(X2)) from the data file S2;

h) in a scanning loop through the data (X1,Sij(X1)) for the multitude M of positions X1:

for each position X1 execute a nested scanning loop through the data (X2,Sij(X2)) for the multitude N of positions X2, and:

if (X1≤X2) then h1) cascade (convert s-parameters to transfer parameters, multiply and convert back to s-parameters) the invers zero matrix $[S0]^{-1}$ with the s-parameters Sij(X2) of the data file S2 and replace in the data file S2;

else if (X1>X2) then h2) cascade the invers s-parameter zero matrix $[S0]^{-1}$ with the s-parameters Sij(X1) of the data file S1 and replace in the data file S1;

i) retrieve the s-parameters Sij(X1) from the data file S1 and Sij(X2) from the data file S2, and:

if (X1≤X2) then cascade the s-parameters of the file S1 with the s-parameters of the data file S2 to create Sij(X1, X2), else if (X1>X2) then cascade the s-parameters of the data file S2 with the s-parameters of the data file S1 to create Sij(X1, X2), and j) save calibration data points in a format (X1, X2, Sij(X1,X2)) in a data file TUNER-CAL(F) for later use.

6. An interpolation method between calibrated data points for the automated load pull tuner as in claim 5 at a frequency F, comprising:

a) retrieve s-parameters Sij(X1,X2) of the calibrated data points from the tuner calibration data file TUNER-CAL (F);

b) define a target position with tuning probe coordinates (X1.t,X2.t);

c) identify, using a numeric search through the s-parameters retrieved in step (a), two pairs of successive calibration data points, one pair of successive X1 positions (X1.1 and X1.2) with X1.1≤X1.t≤X1.2, and one pair of successive X2 positions, (X2.1 and X2.2) with X2.1≤X2.t≤X2.2, which are closest to X1.t and X2.t correspondingly;

d) execute a first set of linear interpolations of s-parameters Sij including one interpolation of X1.t between the X1 successive positions (X1.1 and X1.2) and one interpolation of X2.t between the X2 successive positions (X2.1 and X2.2) yielding interpolated s-parameters Sij(A) and Sij(B);

e) execute a second set of linear interpolations of s-parameters Sij(X1,X2) including one interpolation of X1.t and X2.t between the positions X1.1 and X2.1 and one interpolation of X1.t and X2.t between the positions (X1.2 and X2.2) yielding interpolated s-parameters Sij(C) and Sij(D);

f) calculate Sij parameters at target point (X1.t,X2.t) as an average of a third set of linear interpolations of X1.t and X2.t between the s-parameters Sij(A) and Sij(B) and linear interpolations of X1.t and X2.t between the s-parameters Sij(C) and Sij(D).

7. An impedance synthesis (tuning) method for the automated two-probe waveguide load pull tuner of claim 6 comprising:

a) for a frequency F, define a tuning tolerance TOL and a tuner calibration data file and retrieve s-parameters Sij(X1,X2) from the calibration data file;

b) define a tuning target reflection factor $\Gamma=|\Gamma|*\exp(j\Phi)$ and a maximum number of iterations NMAX;

c) search in s-parameter Sij(X1,X2) for a calibration point Sij(X1o,X2o), for which an error function $EF=|S11(X1o,X2o)-\Gamma|^2$, defined as the square of the absolute vector difference between the reflection factor S11(X1o,X2o) and the target $\Gamma$, is minimum;

d) if EF≤TOL, define X1.final=X1o, X2.final=X2o and move to step (f);

e) set N=1 and search interpolated s-parameter data S11(X1,X2) in the area (X1,X2) close to the calibrated point (X1o,X2o) for a final setting (X1.final,X2.final) as follows:

e1) from starting point (X1o,X2o), in a search loop of position X1 of the tuning probe P #1:

set N=N+1 and change X1o by a small amount δX1 to X1o+δX1, calculate the Error Function $EF=|S11(X1o+\delta X1,X2o)-\Gamma|^2$, make δX1 proportional to the change of EF, increase N and iterate until EF reaches a minimum, and then set X1o'=X1o+δX1;

e2) from a new point (X1o',X2o), in a search loop of position X2 of the tuning probe P #2:

set N=N+1 and change X2o by a small amount δX2 to X2o+δX2, calculate the Error Function $EF=|S11(X1o',X2o+\delta X2)-\Gamma|^2$, make δX2 proportional to the change of EF, increase N and iterate until EF reaches a minimum, and then set X2o'=X2o+δX2;

e3) set X1o=X1o', X2o=X2o' and repeat steps e1) and e2) until there is no further reduction of EF occurs or if N>NMAX;

e4) define X1.final=X1o', X2.final=X2o';

f) move the tuning probe P #1 to X1.final and tuning probe P #2 to X2.final.

* * * * *